(12) United States Patent
Elkholy et al.

(10) Patent No.: US 12,212,342 B2
(45) Date of Patent: Jan. 28, 2025

(54) SYSTEMS FOR AND METHODS OF FRACTIONAL FREQUENCY DIVISION

(71) Applicant: Avago Technologies International Sales Pte. Limited, Singapore (SG)

(72) Inventors: Ahmed Elkholy, Irvine, CA (US); Yousr Ismail, Irvine, CA (US); Adesh Garg, Irvine, CA (US); Ali Nazemi, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/310,737

(22) Filed: May 2, 2023

(65) Prior Publication Data

US 2023/0268929 A1    Aug. 24, 2023

Related U.S. Application Data

(63) Continuation of application No. 17/236,328, filed on Apr. 21, 2021, now Pat. No. 11,683,048.

(51) Int. Cl.
| | |
|---|---|
| H03M 3/00 | (2006.01) |
| H03L 7/099 | (2006.01) |
| H03L 7/00 | (2006.01) |
| H03L 7/087 | (2006.01) |
| H03L 7/197 | (2006.01) |

(52) U.S. Cl.
CPC ............ H03M 3/50 (2013.01); H03L 7/0991 (2013.01); *H03L 7/00* (2013.01); *H03L 7/087* (2013.01); *H03L 7/197* (2013.01); *H03L 7/1976* (2013.01)

(58) Field of Classification Search
CPC ........ H03M 3/50; H03M 3/358; H03M 3/368; H03M 3/00; H03M 1/34; H03L 7/0991
See application file for complete search history.

(56) References Cited

U.S. PATENT DOCUMENTS

| | | |
|---|---|---|
| 10,895,850 B1 * | 1/2021 | Elkholy ............... G04F 10/005 |
| 2017/0288686 A1 | 10/2017 | Gao |
| 2019/0214976 A1 | 7/2019 | Wu et al. |
| 2021/0026309 A1 | 1/2021 | Elkholy |
| 2022/0224344 A1 | 7/2022 | Perrott |

FOREIGN PATENT DOCUMENTS

| | | |
|---|---|---|
| CN | 106537785 A | 3/2017 |
| CN | 110350912 A | 10/2019 |

OTHER PUBLICATIONS

European Search report on EP Appln 22167895.6 dated Sep. 22, 2022.
Notice of Allowance on U.S. Appl. No. 17/236,328 Dtd Feb. 10, 2023.

* cited by examiner

*Primary Examiner* — Joseph J Lauture
(74) *Attorney, Agent, or Firm* — Foley & Lardner LLP (57) ABSTRACT

Systems and methods provide a fractional signal from a delta sigma modulator to a summer, a combination of an integer value and the fractional signal to a divider, and a divided clock signal from the divider in response to the combination and the input clock signal. The systems and methods also delay the divided clock signal in response to a truncation phase error and gain calibration factor from a calibration unit to provide an output clock signal having equal periods.

20 Claims, 6 Drawing Sheets

SYSTEMS FOR AND METHODS OF FRACTIONAL FREQUENCY DIVISION

CROSS REFERENCE OF RELATED PATENT APPLICATIONS

This application is a continuation of U.S. patent application Ser. No. 17/236328, filed Apr. 21, 2021, the entire disclosure of which is incorporated by reference herein.

FIELD OF THE DISCLOSURE

This disclosure generally relates to systems for and methods of frequency division, including but not limited to systems and methods for providing clock signals at different frequencies.

BACKGROUND OF THE DISCLOSURE

In the last few decades, the market for electronic devices has grown by orders of magnitude, fueled by the use of portable devices, and increased connectivity, data transfer and data storage in all manners of devices. Many modern electronic devices rely upon clock signals. For example, systems on a chip (SoCs) often use several clocks domains with different programmable frequencies to realize wide range of functionalities and cover different modes of operation.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

The details of various embodiments of the methods and systems are set forth in the accompanying drawings and the description below.

DETAILED DESCRIPTION

The following IEEE standard(s), including any draft versions of such standard(s), are hereby incorporated herein by reference in their entirety and are made part of the present disclosure for all purposes IEEE 802.3, IEEE 802.11x, IEEE 802.11ad, IEEE 802.11ah, IEEE 802.11aj, IEEE 802.16 and 802.16a, and IEEE 802.11ac. In addition, although this disclosure may reference aspects of these standard(s), the disclosure is in no way limited by these standard(s).

For purposes of reading the description of the various embodiments below, the following descriptions of the sections of the specification and their respective contents may be helpful. Section A describes a network environment and computing environment which may use frequency division according to some embodiments described herein, and Section B describes embodiments of systems for and method of frequency division. Although this disclosure can reference aspects of various standard(s) and specification(s), the disclosure is in no way limited to these aspects.

In some embodiments, systems and methods provide clock domains for integrated circuits (e.g., SoCs). The systems and methods can reduce area and power consumption overhead associated with phase locked loop (PLL) cores that are used to generate the clock signals. In some embodiments, systems and methods meet frequency resolution, range, and low-jitter requirements that are very difficult to realize using conventional PLL cores. In some embodiments, a fractional divider is provided in silicon products, application specific circuits (ASIC), digital signal processors, programmable logic circuits, SoCs, or standard products that need highly programmable, low-jitter clock generators. In some embodiments, a fractional divider provides very fine ratio-based frequency resolution, uses small silicon area, provides low-jitter performance, provides unlimited frequency modulation capability, and is scalable and portable to newer integrated circuit processes. In some embodiments, systems and methods of fractional frequency division are used in modern high-speed and power-efficient data communication and processing systems, including but not limited to any backplane, serial deserializer (SERDES), Ethernet physical layer (PHY), optical transceiver, digital signal processor (DSP) module in coherent transceivers, input/output (I/O) interfaces, multicore processors, memories, power management, and wireless transceivers.

Some embodiments relate to a fractional divider for providing a clock output signal at a first frequency. The fractional divider includes a first input configured to receive an input signal and a second input configured to receive data representing a fractional divisor. The input signal is provided at a second frequency. The fractional divider also includes a coarse programmable divider configured to receive the fractional divisor and divide the input signal frequency in accordance with the fractional divisor. The coarse divider provides a divided signal. The divided signal is at the first frequency but with large jitter. The fractional divider also includes a digital to time converter configured to receive the divided signal and a delay control signal, The time converter is configured to provide the clock output signal in response to the delay control signal and a gain calibration factor. Also, the fractional divider includes a calibration unit configured to provide the gain calibration factor in response to a least mean square correlation associated with deterministic jitter error. The clock output signal of the time converter is a precise, low-jitter divided signal at the first frequency.

Some embodiments relate to a method of providing fractional frequency division on an input clock signal. The method includes providing a fractional signal from a delta sigma modulator to a summer, providing a combination of an integer value and the fractional signal to a coarse divider, and providing a divided clock signal from the coarse divider in response to the combination and the input clock signal. The method also includes delaying the divided clock signal in response to a truncation phase error and gain calibration factor from a calibration unit to provide an output clock signal having equal precise periods.

Some embodiments relate to a fractional divider for providing a clock output signal at a first frequency. The fractional divider includes a coarse divider configured to receive a fractional divisor and divide an input signal in accordance with the fractional divisor. The divider provides a divided signal. The divided signal is at the first frequency, and the input signal is provided at a second frequency. The fractional divider also includes a modulator configured to provide a fractional value for the fractional divider and a truncation phase error. The fractional divider also includes a digital to time converter configured to receive the divided signal and provide the clock output signal in response to a gain calibration factor and the truncation phase error. The fractional divider also includes a calibration unit configured to provide the gain calibration factor in response to an accurate calibration engine based on a correlation algorithm. While least-mean square (LMS) has been described here, other steepest-gradient methods may be substituted, such as recursive least squares (RLS), and modifications of LMS, RLS, or other methods.

A. Computing and Network Environment

Figure 1A:
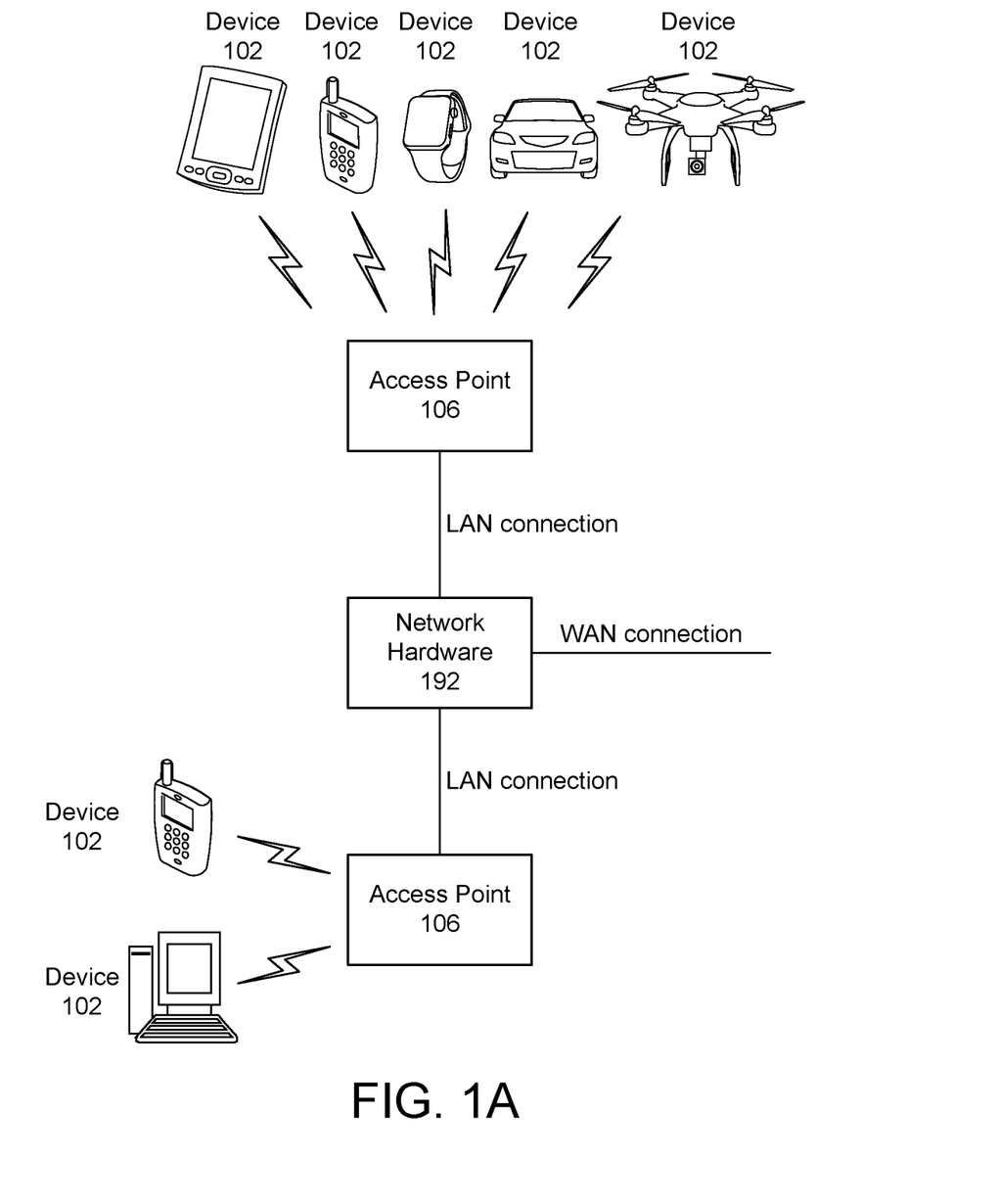
FIG. 1A is a block diagram depicting an embodiment of a computing environment including one or more access points in communication with one or more wireless devices or stations.

Prior to discussing specific embodiments of the present solution, it may be helpful to describe aspects of the operating environment as well as associated system components (e.g., hardware elements) in connection with the methods and systems described herein. Referring to FIG. 1A, an embodiment of a network environment is depicted. The network include or be in communication with a SAN, security adapters, or ethernet converged network adapter (CAN). In brief overview, the network environment includes a wireless communication system that includes one or more access points 106, one or more wireless communication devices 102 and a network hardware component 192. The wireless communication devices 102 may for example include laptop computers 102, tablets 102, personal computers 102, wearable devices 102, vehicles 102 (e.g., automobiles, drones, smart vehicles, robotic units, etc.) and/or cellular telephone devices 102. The details of an embodiment of wireless communication devices 102 and/or access point 106 are described in greater detail with reference to FIGS. 1B and 1C. The network environment can be an ad hoc network environment, an infrastructure wireless network environment, a wired network coupled to a wireless network, a subnet environment, etc. in one embodiment.

The access points (APs) 106 may be operably coupled to the network hardware 192 via local area network connections. The network hardware 192, which may include a router, gateway, switch, bridge, modem, system controller, appliance, etc., may provide a local area network connection for the communication system. Each of the access points 106 may have an associated antenna or an antenna array to communicate with the wireless communication devices in its area. The wireless communication devices may register with a particular access point 106 to receive services from the communication system (e.g., via a SU-MIMO or MU-MIMO configuration). For direct connections (i.e., point-to-point communications), some wireless communication devices may communicate directly via an allocated channel and communications protocol. Some of the wireless communication devices 102 may be mobile or relatively static with respect to the access point 106.

In some embodiments an access point 106 includes a device or module (including a combination of hardware and software) that allows wireless communication devices 102 to connect to a wired network using Wi-Fi, or other standards. An access point 106 may sometimes be referred to as a wireless access point (WAP). An access point 106 may be configured, designed and/or built for operating in a wireless local area network (WLAN). An access point 106 may connect to a router (e.g., via a wired network) as a stand-alone device in some embodiments. In other embodiments, an access point 106 can be a component of a router. An access point 106 can provide multiple devices access to a network. An access point 106 may, for example, connect to a wired Ethernet connection and provides wireless connections using radio frequency links for other devices 102 to utilize that wired connection. An access point 106 may be built and/or configured to support a standard for sending and receiving data using one or more radio frequencies. Those standards, and the frequencies they use may be defined by the IEEE (e.g., IEEE 802.11 standards). An access point 106 may be configured and/or used to support public Internet hotspots, and/or on an internal network to extend the network's Wi-Fi signal range.

In some embodiments, the access points 106 may be used for in-home or in-building wireless networks (e.g., IEEE 802.11, Bluetooth, ZigBee, any other type of radio frequency based network protocol and/or variations thereof). Each of the wireless communication devices 102 may include a built-in radio and/or is coupled to a radio. Such wireless communication devices 102 and/or access points 106 may operate in accordance with the various aspects of the disclosure as presented herein to enhance performance, reduce costs and/or size, and/or enhance broadband applications. Each wireless communication devices 102 may have the capacity to function as a client node seeking access to resources (e.g., data, and connection to networked nodes such as servers) via one or more access points.

The network connections may include any type and/or form of network and may include any of the following: a point-to-point network, a broadcast network, a telecommunications network, a data communication network, a computer network. The topology of the network may be a bus, star, or ring network topology. The network may be of any such network topology as known to those ordinarily skilled in the art capable of supporting the operations described herein. In some embodiments, different types of data may be transmitted via different protocols. In other embodiments, the same types of data may be transmitted via different protocols.

Figure 1B:
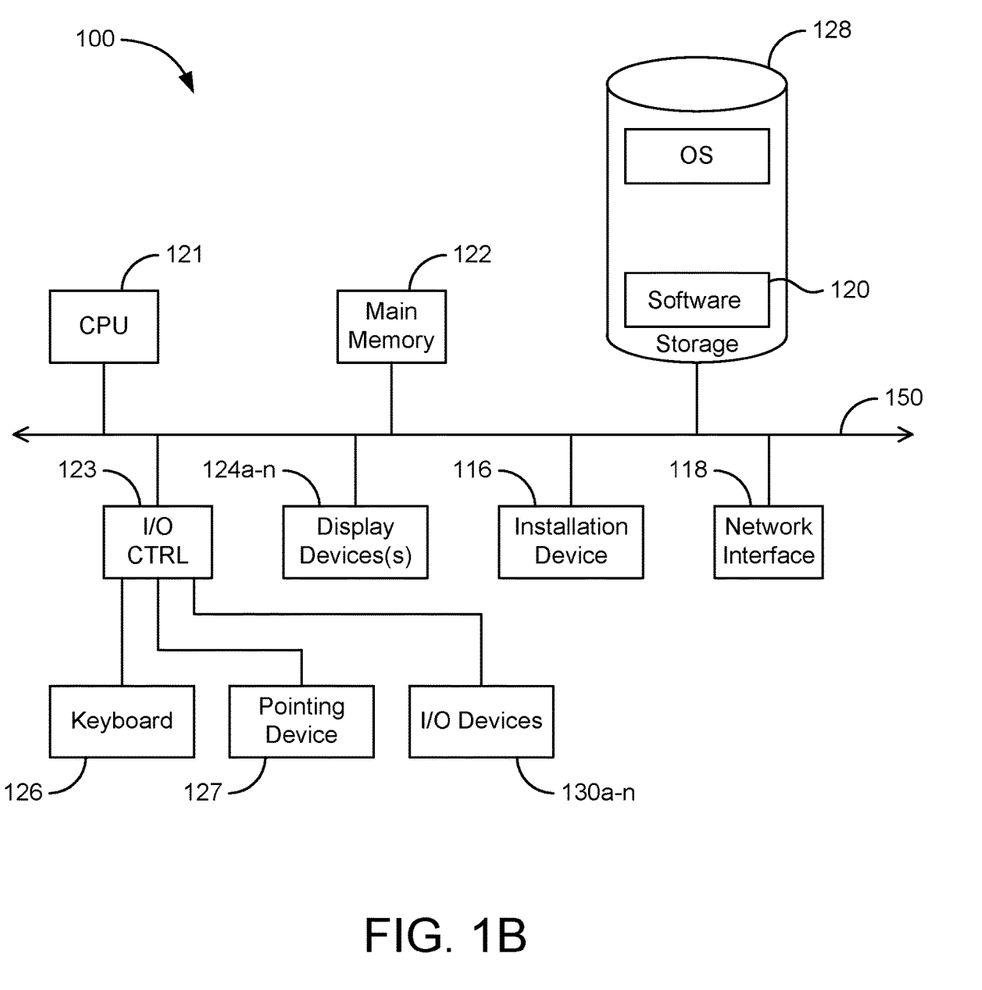
FIGS. 1B and 1C are block diagrams depicting embodiments of computing devices useful in connection with the methods and systems described herein.
Figure 1C:
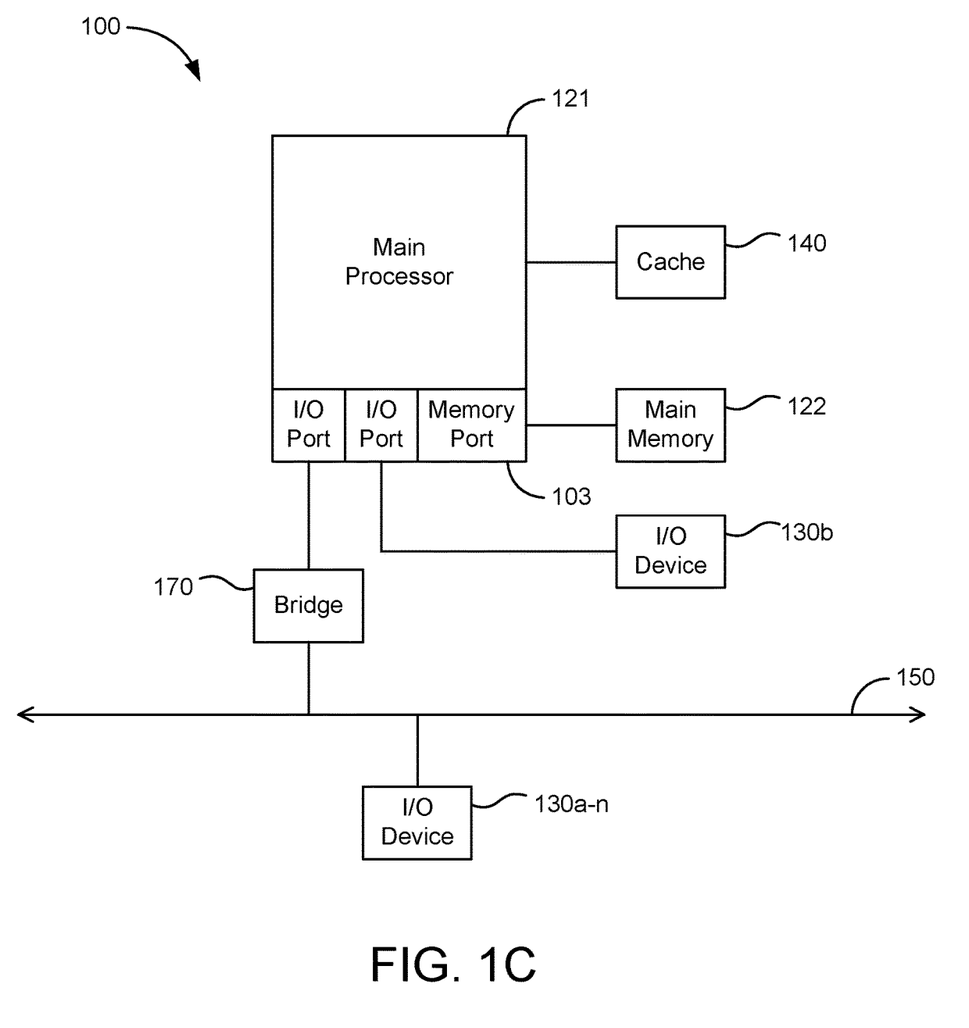

The communications device(s) 102 and access point(s) 106 may be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the wireless communication device 102 or access point 106. As shown in FIGS. 1B and 1C, each computing device 100 includes a central processing unit 121, and a main memory unit 122. As shown in FIG. 1B, a computing device 100 may include a storage device 128, an installation device 116, a network interface 118, an I/O controller 123, display devices 124a-101n, a keyboard 126 and a pointing device 127, such as a mouse. The storage device 128 may include, without limitation, an operating system and/or software. As shown in FIG. 1C, each computing device 100 may also include additional optional elements, such as a memory port 103, a bridge 170, one or more input/output devices 130a-

130*n* (generally referred to using reference numeral 130), and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, such as: those manufactured by Intel Corporation of Mountain View, California; those manufactured by International Business Machines of White Plains, New York; or those manufactured by Advanced Micro Devices of Sunnyvale, California. The computing device 100 may be based on any of these processors, or any other processor capable of operating as described herein.

Main memory unit 122 may be one or more memory chips capable of storing data and allowing any storage location to be directly accessed by the microprocessor 121, such as any type or variant of Static random access memory (SRAM), Dynamic random access memory (DRAM), Ferroelectric RAM (FRAM), NAND Flash, NOR Flash and Solid State Drives (SSD). The main memory 122 may be based on any of the above described memory chips, or any other available memory chips capable of operating as described herein. In the embodiment shown in FIG. 1B, the processor 121 communicates with main memory 122 via a system bus 150 (described in more detail below). FIG. 1C depicts an embodiment of a computing device 100 in which the processor communicates directly with main memory 122 via a memory port 103. For example, in FIG. 1C the main memory 122 may be DRDRAM.

FIG. 1C depicts an embodiment in which the main processor 121 communicates directly with cache memory 140 via a secondary bus, sometimes referred to as a backside bus. In other embodiments, the main processor 121 communicates with cache memory 140 using the system bus 150. Cache memory 140 typically has a faster response time than main memory 122 and is provided by, for example, SRAM, BSRAM, or EDRAM. In the embodiment shown in FIG. 1C, the processor 121 communicates with various I/O devices 130 via a local system bus 150. Various buses may be used to connect the central processing unit 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor 121 may use an Advanced Graphics Port (AGP) to communicate with the display 124. FIG. 1C depicts an embodiment of a computer or computer system 100 in which the main processor 121 may communicate directly with I/O device 130*b*, for example via HYPERTRANSPORT, RAPIDIO, or INFINIBAND communications technology. FIG. 1C also depicts an embodiment in which local busses and direct communication are mixed: the processor 121 communicates with I/O device 130*a* using a local interconnect bus while communicating with I/O device 130*b* directly.

A wide variety of I/O devices 130*a*-130*n* may be present in the computing device 100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices may be controlled by an I/O controller 123 as shown in FIG. 1B. The I/O controller may control one or more I/O devices such as a keyboard 126 and a pointing device 127, e.g., a mouse or optical pen. Furthermore, an I/O device may also provide storage and/or an installation medium 116 for the computing device 100. In still other embodiments, the computing device 100 may provide USB connections (not shown) to receive handheld USB storage devices such as the USB Flash Drive line of devices manufactured by Twintech Industry, Inc. of Los Alamitos, California.

Referring again to FIG. 1B, the computing device 100 may support any suitable installation device 116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 100 may further include a storage device, such as one or more hard disk drives or redundant arrays of independent disks, for storing an operating system and other related software, and for storing application software programs such as any program or software 120 for implementing (e.g., software 120 configured and/or designed for) the systems and methods described herein. Optionally, any of the installation devices 116 could also be used as the storage device. Additionally, the operating system and the software can be run from a bootable medium.

Furthermore, the computing device 100 may include a network interface 118 to interface to the network 104 through a variety of connections including, but not limited to, standard telephone lines, LAN or WAN links (e.g., 802.11, T1, T3, 56kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 100 communicates with other computing devices 100' via any type and/or form of gateway or tunneling protocol such as Secure Socket Layer (SSL) or Transport Layer Security (TLS). The network interface 118 may include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In some embodiments, the computing device 100 may include or be connected to one or more display devices 124*a*-124*n*. As such, any of the I/O devices 130*a*-130*n* and/or the I/O controller 123 may include any type and/or form of suitable hardware, software, or combination of hardware and software to support, enable or provide for the connection and use of the display device(s) 124*a*-124*n* by the computing device 100. For example, the computing device 100 may include any type and/or form of video adapter, video card, driver, and/or library to interface, communicate, connect or otherwise use the display device(s) 124*a*-124*n*. In one embodiment, a video adapter may include multiple connectors to interface to the display device(s) 124*a*-124*n*. In other embodiments, the computing device 100 may include multiple video adapters, with each video adapter connected to the display device(s) 124*a*-124*n*. In some embodiments, any portion of the operating system of the computing device 100 may be configured for using multiple displays 124*a*-124*n*. One ordinarily skilled in the art will recognize and appreciate the various ways and embodiments that a computing device 100 may be configured to have one or more display devices 124a-124n.

In further embodiments, an I/O device 130 may be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device or system 100 of the sort depicted in FIGS. 1B and 1C may operate under the control of an operating system, which control scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Washington; MAC OS, produced by Apple Computer of Cupertino, California; WebOS, produced by Research In Motion (RIM); OS/2, produced by International Business Machines of Armonk, New York; and Linux, a freely-available operating system distributed by Caldera Corp. of Salt Lake City, Utah, or any type and/or form of a Unix operating system, among others.

The computer system 100 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. The computer system 100 has sufficient processor power and memory capacity to perform the operations described herein.

In some embodiments, the computing device 100 may have different processors, operating systems, and input devices consistent with the device. For example, in one embodiment, the computing device 100 is a smart phone, mobile device, tablet or personal digital assistant. In still other embodiments, the computing device 100 is an Android-based mobile device, an iPhone smart phone manufactured by Apple Computer of Cupertino, California, or a Blackberry or WebOS-based handheld device or smart phone, such as the devices manufactured by Research In Motion Limited. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein. Aspects of the operating environments and components described above will become apparent in the context of the systems and methods disclosed herein.

B. Systems for and Methods of Fractional Frequency Division

Figure 2:
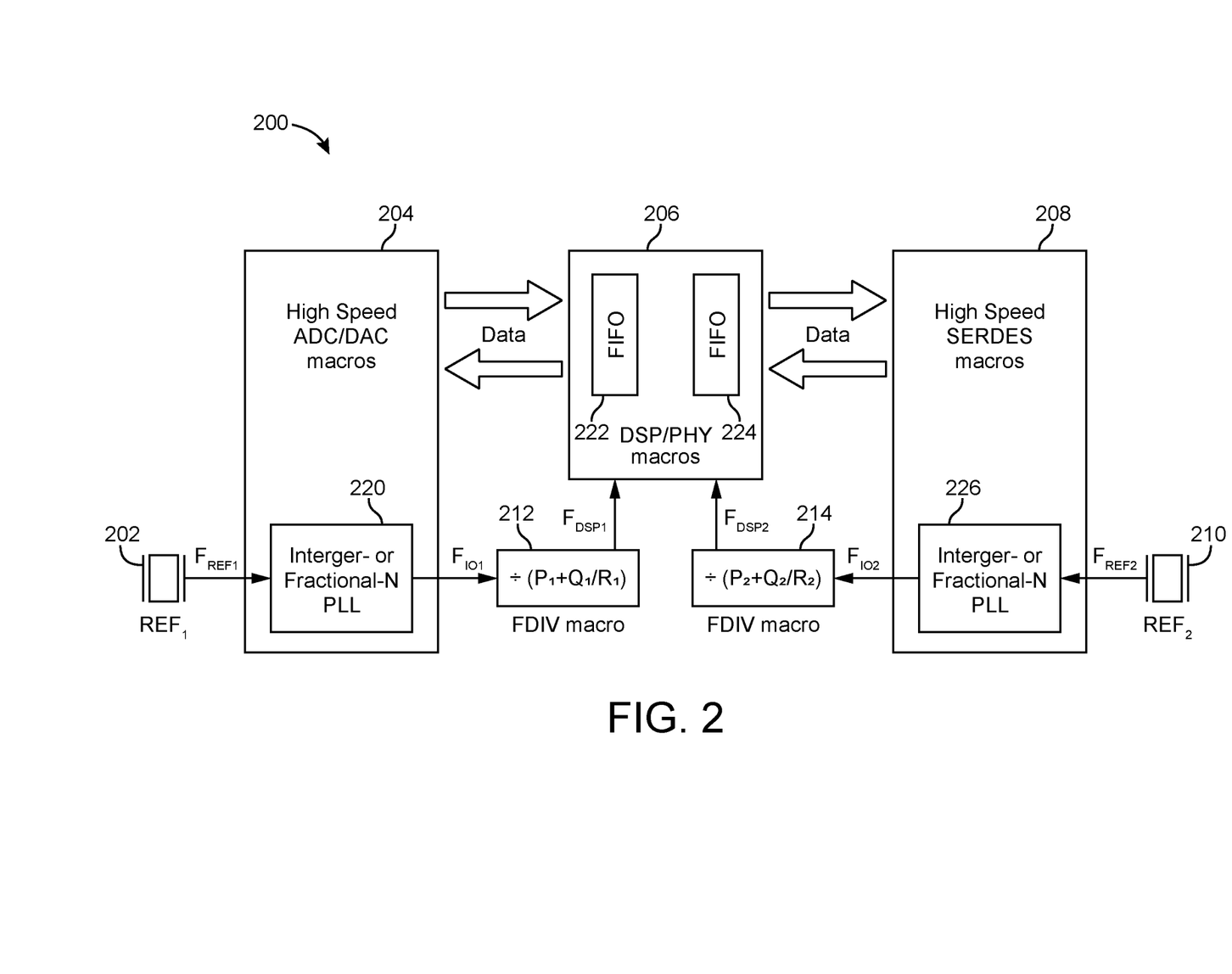
FIG. 2 is a block diagram depicting an exemplary system including a pair of fractional frequency dividers, according to one or more embodiments.

With reference to FIG. 2, a system 200 is a DSP SERDES interface for use in a complex SOC. Although FIG. 2 depicts a particular application, the frequency division systems and methods can be used in any electronic application. In some embodiments, system 200 provides a high speed mixed-signal interface to allow operation up to 3 gigahertz (GHz). In some embodiments, the clock signals have frequencies between 1 and 5 GHz. System 200 can be used in the systems described with reference to FIGS. 1A-C.

In some embodiments, the system 200 includes a signal source 202, an analog to digital converter/digital to analog converter (ADC/DAC) unit 204, DSP/PHY unit 206, a high speed SERDES unit 208, a signal source 210, a fractional divider 212, and a fractional divider 214. Units 204, 206 and 208 can operate at different clock frequencies (e.g., driven by different clock signals) in some embodiments. In some embodiments, the fractional divider 212 and fractional divider 214 provide programmable levels of synchronous fractional frequency division for DSP/PHY unit 206 or other type of electronic device.

Signal source 202 is a crystal integrated circuit that provides a first reference frequency signal at a first frequency in some embodiments. The first reference frequency signal is provided to the ADC/DAC unit 204. Signal source 210 is a crystal integrated circuit that provides a second reference frequency signal at a second frequency in some embodiments. The second reference frequency signal is provided to the SERDES unit 208.

The ADC/DAC unit 204 is a high speed macro, unit, circuit, logic, or other implementation that can provide and receive data to and from DSP/PHY unit 206. ADC/DAC unit 204 includes an integer or fractional N PLL 220 in some embodiments. PLL 220 receives the reference frequency signal from the signal source 202 and provides a clock signal at a first clock frequency. The first clock signal can be a square wave or other signal for driving gates, processors or other logic provided at a frequency $F_{I/O1}$ in some embodiments. The first clock signal can be a divided (e.g., integer or fractional) signal of the reference frequency signal and can be used by The ADC/DAC unit 204 to convert or otherwise process data.

The DSP/PHY unit 206 processes data provided between units 204 and 208. DSP/PHY unit 206 includes first in, first out (FIFO) memory 222 and FIFO memory 224. FIFO memory 222 and FIFO memory 224 handle synchronization for communications between units 204 and 208 relying upon clock signals provided from fractional dividers 212 and 214.

The SERDES unit 208 is a high speed macro, unit, circuit, logic, or other implementation that can provide and receive data to and from DSP/PHY unit 206. SERDES unit 208 includes an integer or fractional N PLL 226 in some embodiments. PLL 226 receives a reference frequency signal from the signal source 210 and provides a clock signal at a second clock frequency. The second clock signal can be a square wave or other signal for driving gates, processors or other logic provided at a frequency $F_{I/O2}$ in some embodiments. The second clock signal can be a divided (e.g., integer or fractional) signal of the second reference frequency signal from signal source 210 and can be used by SERDES unit 208 to convert signals and data. The second clock signal can also be provided to fractional divider 214.

Fractional divider 212 is a macro, unit, circuit, logic, or other implementation that can provide a first divided clock signal at a selectable frequency using fractional division. In some embodiments, the fractional divider 212 divides the first clock signal by a divisor (e.g., the sum of an integer P1 and the quotient of an integer Q1 divided by R1) to provide the first divided signal at a frequency $F_{DSP1}$. Fractional divider 214 is a macro, unit, circuit, logic, or other implementation that can provide a second divided clock signal at a selectable frequency using fractional division. In some embodiments, the fractional divider 214 divides the second clock signal by a divisor (e.g., the sum of an integer P2 and the quotient of an integer Q2 divided by R2) to provide the second divided signal at a frequency $F_{DSP2}$. In some embodiments, fractional dividers 212 and 214 are stand-alone fractional divider (FDIV) macros. An exemplary structure for fractional dividers 212 and 214 is described below with reference to FIG. 3, however, other fractional division architectures and techniques can be utilized.

Units 204 and 208 operate independently at different clock rates, and FIFO memories 222 and 224 handle the synchronization relying on precise ratios between clock frequencies ($F_{I/O1}$, $F_{I/O2}$, ... etc.) and DSP clock frequencies ($F_{DSP1}$, $F_{DSP2}$, etc.) in some embodiments. Fractional dividers 212 and 214 advantageously do not employ multiple dividers and PLL cores to realize the desired ratios ($F_{DSP1}/F_{I/O1}=N_1/M_1$, $F_{DSP2}/F_{I/O2}=N_2/M_2$, etc.) where $N_1$, $M_1$, $N_2$, and $M_2$ are integers in some embodiments. Fractional dividers 212 and 214 advantageously do not occupy large silicon area and do not consume high power and yet meet tighter jitter specifications associated with the increased data rates in some embodiments.

In some embodiments, fractional dividers 212 and 214 are reconfigurable and greatly simplify frequency planning in complex SoCs. In some embodiments, fractional dividers 212 and 214 reuse available high frequency clock signals from units 204 and 208 or share a single PLL core to generate multiple independent output clock signals. In some embodiments, fractional dividers 212 and 214 can achieve exact frequency ratios with very fine delta sigma ($\Delta\Sigma$) frequency resolution (up to 44 bit) for both numerator and denominator. In some embodiments, fractional dividers 212 and 214 are implemented in an all digital circuit (e.g., all complementary metal oxide semiconductor (CMOS)) that is compact (one or two orders of magnitude smaller than a PLL core), scalable and easily portable to newer processes. In some embodiments, the fractional dividers 212 and 214 also achieve excellent low-jitter performance (<0.5$ps_{rms}$) across process-voltage-temperature (PVT) variations by using an adaptive background calibration technique. In some embodiments, fractional dividers 212 and 214 use an open loop architecture that overcomes the bandwidth limitation of PLLs and achieves ideal spread spectrum modulation and instantaneous frequency switching without any frequency overshoot.

Figure 3:
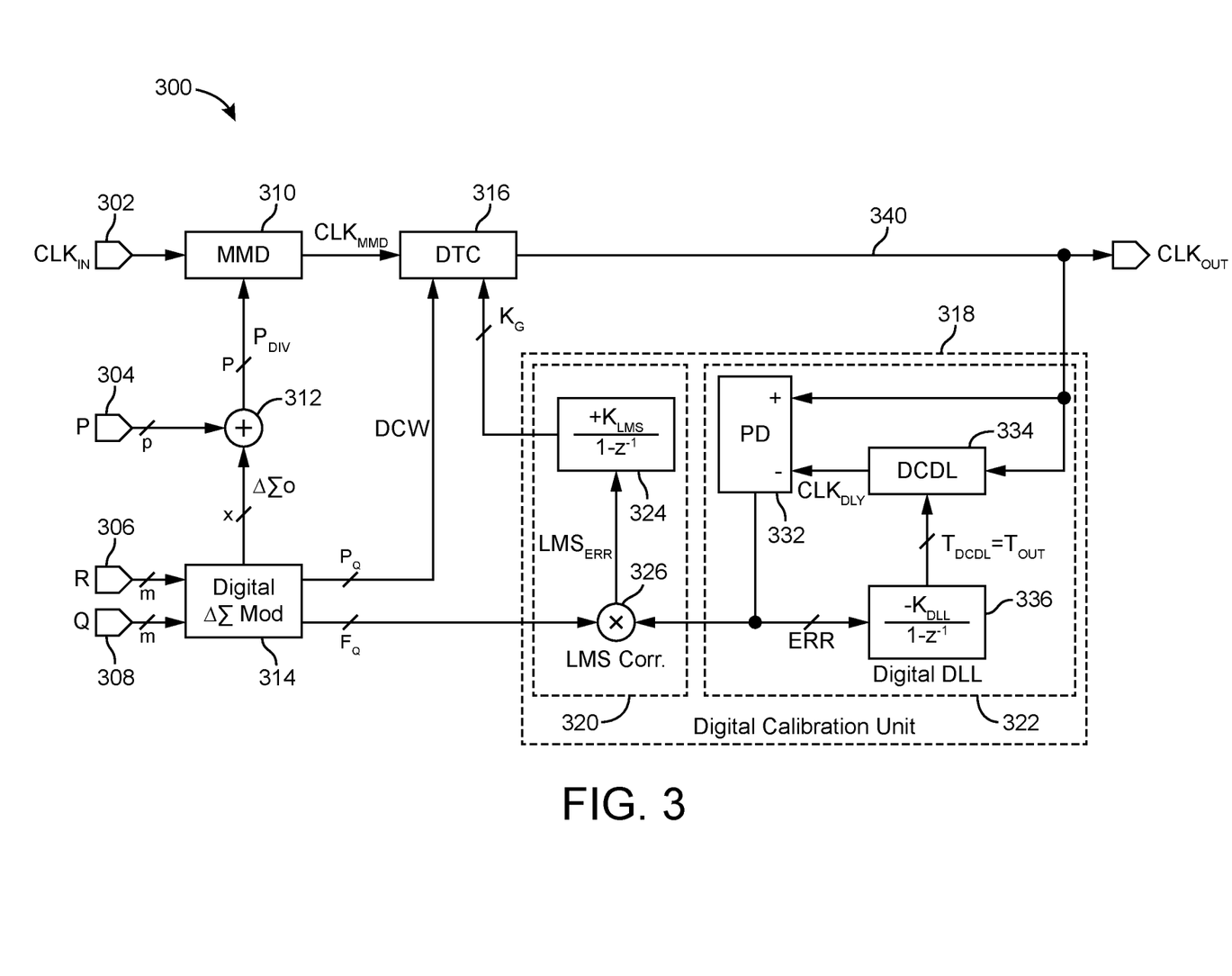
FIG. 3 is a block diagram of a fractional divider for the system illustrated in FIG. 2, according to one or more embodiments.

With reference to FIG. 3, a fractional divider 300 can be used as fractional dividers 212 and 214 (FIG. 2) or in other applications. The fractional divider 300 includes a clock input 302 for a $CLK_{IN}$ signal, an integer input 306 for digital data representing an integer P, an integer input 306 for digital data representing an integer R, an integer input 308 for digital data representing an integer Q, a divider 310, a summer 312, a modulator 314, a digital-to-time converter (DTC), a digital calibration unit and a clock output 340 for a $CLK_{OUT}$ signal. The fractional divider 300 is a stand alone digital divider in some embodiments. As the fractional divider 300 operates over cycles of the output clock signal $CLK_{OUT}$, the error is further corrected such that a more precise division of the input clock signal $CLK_{IN}$ is obtained. The fractional divider 300 provides very wide and continuous frequency range (for example 1 MHz-3 GHz) with very fine ratio-based frequency resolution (up to 44 bit) in some embodiments. In some embodiments, voltage controlled oscillators are not used, and the fractional divider is inherently robust against crosstalk and noise coupling, thereby providing great flexibility in the placement of the circuit in the chip floor plan.

Divider 310 is a multi-modulus divider (MMD). Divider 310 frequency divides the $CLK_{IN}$ signal by a divisor (e.g., $P_{DIV}$) and provides a $CLK_{MMD}$ signal. The frequency of the $CLK_{MMD}$ is equal to the frequency of the $CLK_{IN}$ signal divided by P plus Q/R which is equal to $P_{DIV}$. The divisor $P_{DIV}$ is provided by summer 312 in some embodiments. The $CLK_{MMD}$ signal includes a truncation phase error (PQ) introduced by the modulator 314. Divider 310 is a coarse divider in some embodiments.

The summer 312 receives the integer P as an p-bit word at input 304 in some embodiments. p is an integer. In some embodiments, p is 4, 8, 14, 16, etc. Summer 312 receives a value $\Delta\Sigma_o$ as a x-bit word representing the quotient of Q/R for modulator 314. x is an integer. In some embodiments, x is 16, 32, 64 etc. Summer 312 provides the value $P_{DIV}$ to divider 310. The value $P_{DIV}$ is used to modulate the divider 310 to provide the $CLK_{MMD}$ signal at the appropriate divided frequency.

Modulator 314 is a delta sigma modulator configured to provide the value $\Delta\Sigma_o$ to the summer 312. The modulator 314 is a first order or second order modulator in some embodiments. The modulator 314 receives m-bit words for values R and Q at inputs 306 and 308. Modulator 314 is configured to truncate the very fine resolution m-bit words for R and Q into a representation of the quotient (the value $\Delta\Sigma_o$) having less bits (x equals 1 for a first order delta sigma modulator) in some embodiments. The value $\Delta\Sigma_o$ (the sigma delta output) is provided to summer 312. In some embodiments, the modulator 314 is configured to realize exact frequency ratio where both numerator and denominator can be set independently via R and Q values.

The DTC 316 receives the $CLK_{MMD}$ signal and provides the $CLK_{OUT}$ signal in response to delay control word (DCW) form the modulator 316 and a gain calibration factor $K_G$ in some embodiments. The DTC 316 is a high resolution DTC and is configured to cancel instantaneous phase error from the modulator 314. The truncation phase error $P_Q$ introduced by the modulator 314 is provided to the DTC 316 by the modulator 314. The truncation phase error $P_Q$ appears as deterministic jitter (DJ) at the $CLK_{MMD}$ signal and is removed from clock signal $CLK_{OUT}$ by the DTC 316 action. In some embodiments, the DTC 316 is configured to cancel the instantaneous phase error by adding equal and opposite amounts of phase shift to effectively cancel the sigma delta quantization error and achieve robust low-jitter performance across PVT. In some embodiments, the gain of DTC 316 is calibrated in background to match the input clock period $T_{IN}$ of input clock signal $CLK_{IN}$ using the digital calibration unit 318.

The digital calibration unit 318 includes a correlator 320 and a delay locked loop 322 in some embodiments. The correlator 320 provides calibration and is a least means square correlator in some embodiments. The correlator 320 includes a multiplier 326 and a filter 324 in some embodiments. The locked loop 322 is a digital delay locked loop (DLL) in some embodiments. The locked loop 322 includes a phase detector 332, a digitally controlled delay line (DCDL) unit 334 and a filter 336. Filters 336 and 324 are digital filters in some embodiments. Digital calibration unit 318 is configured to control the gain of the DTC 316 via the gain calibration factor KG in response to the output clock signal $CLK_{OUT}$. In some embodiments, the loop 322 with the phase detector 332 prevents sticking and false harmonic locking.

Any deviation in the DTC 316 gain from input clock period TIN, appears as DJ and period fluctuations at the output clock signal $CLK_{OUT}$. The locked loop 322 detects output clock period jitter. Locked loop 322 ensures the output clock signal $CLK_{OUT}$ and delay signal $CLK_{DLY}$ from controlled delay line unit 334 are separated precisely by one period TOUT on average sense. Phase detector 332 provides an error signal ERR based on a difference between the clock output signal $CLK_{OUT}$ and delay signal $CLK_{DLY}$ from controlled delay line unit 334. The error signal ERR represents detected residual deterministic jitter due to gain error of the DTC 316. The error signal ERR is filtered by filter 336 and provided to DCDL unit 334. The filter 336 has a response of $-K_{DLL}/(1-z^-)$ (e.g., in its simplest form) where $K_{DLL}$ is a constant for the loop 322. The correlator 320 (e.g., least-mean square (LMS) correlator) uses error signal ERR to set gain calibration factor of DTC ($K_G$) precisely in a background manner to achieve excellent low-jitter performance across PVT.

The multiplier 326 of the correlator 320 receives the error signal ERR and the signal $F_Q$ from the modulator 314 and provides an LMS error signal $LMS_{ERR}$. The LMS error signal $LMS_{ERR}$ is provided to filter 324, which provides the gain calibration factor KG to the DTC 316. The filter 324 has a response of $K_{LMS}/(1-z^{-1})$ (e.g., in its simplest form) where $K_{LMS}$ is a constant. In some embodiments, the LMS error signal $LMS_{ERR}$ is equal to the error signal ERR multiplied by instantaneous phase error or frequency quantization error $F_Q$. In some embodiments, the LMS error signal $LMS_{ERR}$ is equal to instantaneous phase error $F_Q$ squared multiplied by the error signal ERR multiplied by the difference of the input clock period $T_{IN}$ and the gain of DTC 316 ($K_{DTC}$).

Figure 4:
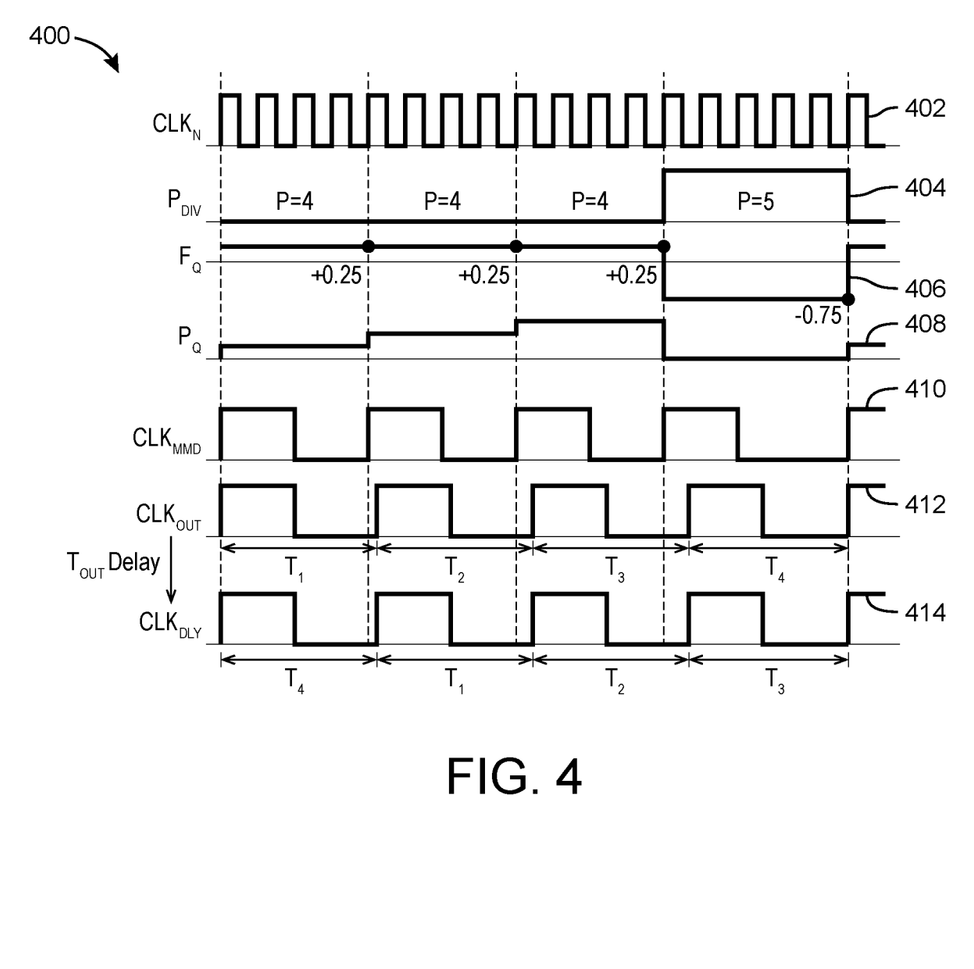
FIG. 4 is a timing diagram showing clock signals associated with the fractional divider illustrated in FIG. 3, according to one or more embodiments.

With reference to FIG. 4, a timing diagram 400 includes a signal 402 representing the input clock signal $CLK_{IN}$, a signal 404 representing the value $P_{DIV}$, a signal 406 representing the value $F_Q$, a signal 408 representing the value $P_Q$, a signal 410 representing the signal $CLK_{MMD}$, a signal 412 representing the signal $CLK_{OUT}$, and a signal 414 representing the signal $CLK_{DLY}$. The timing diagram is exemplary and can represent signals used by fractional divider 300 (FIG. 3). The timing diagram 400 represents an example of a divide by 4.25 operation using a first order delta sigma modulator (e.g., the modulator 314). A division ratio of 4.25 (P=four and Q/R=¼) is realized by dividing the input clock signal $CLK_{IN}$ by four for three cycles and by five for one cycle in a repetitive manner. The selections for P, Q, and R are exemplary only; other values can be utilized.

Timing diagram 400 shows that the signal $CLK_{MMD}$ (signal 410) has three periods $T_1$, $T_2$, and $T_3$ with equal lengths corresponding to 4 periods of the input clock signal $CLK_{IN}$ (signal 402) and one period $T_4$ corresponding to 5 periods of the input clock signal $CLK_{IN}$ (signal 402). The signal $CLK_{OUT}$ (signal 412) has four periods $T_1$, $T_2$, $T_3$, and $T_4$ with equal lengths corresponding to 4.25 periods of the input clock signal $CLK_{IN}$ (signal 402). The signal $CLK_{DLY}$ (signal 414) has four periods $T_1$, $T_2$, $T_3$, and $T_4$ with equal lengths corresponding to 4.25 periods of the input clock signal $CLK_{IN}$ (signal 402). The signal $CLK_{DLY}$ (signal 414) is delayed one period from the signal $CLK_{OUT}$ (signal 412).

It should be noted that certain passages of this disclosure can reference terms such as "first" and "second" in connection with devices signals, data, inputs, channels, etc., for purposes of identifying or differentiating one from another or from others. These terms are not intended to merely relate entities (e.g., a first input and a second input) temporally or according to a sequence, although in some cases, these entities can include such a relationship. Nor do these terms limit the number of possible entities (e.g., devices) that can operate within a system or environment.

It should be understood that the systems described above can provide multiple ones of any or each of those components. In addition, the systems and methods described above can be provided as one or more computer-readable programs or executable instructions, programmable circuits, or digital logic embodied on or in one or more articles of manufacture. The article of manufacture can be a floppy disk, a hard disk, a CD-ROM, a flash memory card, a PROM, a RAM, a ROM, ASIC or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. A fractional divider for providing a clock output signal, the fractional divider comprising:
 a first circuit configured to receive a first signal and provide the clock output signal in response to a gain calibration factor and a delay control word; and
 a second circuit configured to provide the gain calibration factor in response to a deterministic jitter error associated with the clock output signal, wherein the second circuit comprises a digital delay locked loop and a least mean square correlator, the least mean square correlator receiving an error signal from the digital delay locked loop.

2. The fractional divider of claim 1, wherein the fractional divider is an all digital implementation.

3. A fractional divider for providing a clock output signal, the fractional divider comprising:
 a first circuit configured to receive a first signal and provide the clock output signal in response to a gain calibration factor and a delay control word;
 a second circuit configured to provide the gain calibration factor in response to a deterministic jitter error associated with the clock output signal; and
 a delta sigma modulator configured to provide a fractional portion of a fractional divisor to a divider circuit coupled to the first circuit, wherein the second circuit is configured to provide the gain calibration factor using the fractional divisor, the fractional divisor having very fine resolution for both a numerator and a denominator.

4. The fractional divider of claim 3, wherein the delta sigma modulator provides a multi-bit signal representing a frequency quantization error ($F_Q$) to the second circuit.

5. The fractional divider of claim 4, wherein the second circuit performs a least mean square correlation in response to the multi-bit signal representing the frequency quantization error ($F_Q$) from the delta sigma modulator and an error signal from a delay locked loop.

6. The fractional divider of claim 3, wherein the second circuit comprises a digital delay locked loop and a least mean square correlator, the least mean square correlator receiving an error signal from the digital delay locked loop.

7. The fractional divider of claim 6, wherein the digital delay locked loop comprising a phase detector, a digitally controlled delay unit, and a digital filter.

8. The fractional divider of claim 3, wherein the second circuit comprises a least mean square correlator and a digital delay locked loop comprising a phase detector, a digitally controlled delay unit, and a digital filter, the least mean square correlator receiving an error signal from the digital delay locked loop.

9. The fractional divider of claim 3, wherein the clock output signal has equal time periods and the first signal does not have equal time periods.

10. A fractional divider for providing a clock output signal, the fractional divider comprising:
a first circuit configured to receive a first signal and provide the clock output signal in response to a gain calibration factor and a delay control word; and
a second circuit configured to provide the gain calibration factor in response to a deterministic jitter error associated with the clock output signal, wherein the clock output signal has equal time periods and the first signal does not have equal time periods.

11. The fractional divider of claim 10, further comprising:
a delta sigma modulator configured to provide a fractional portion of a fractional divisor, a second signal to the first circuit and a third signal to the second circuit.

12. The fractional divider of claim 10, wherein the second circuit comprises a digital delay locked loop and a least mean square correlator, the least mean square correlator receiving an error signal from the digital delay locked loop.

13. The fractional divider of claim 12, wherein the digital delay locked loop comprising a phase detector, a digitally controlled delay unit, and a digital filter.

14. A method of providing fractional frequency division on an input clock signal, the method comprising:
providing a divided clock signal from a divider in response to the input clock signal;
delaying the divided clock signal in response to a truncation phase error and gain calibration factor from a calibration unit to provide an output clock signal having equal periods; and
comparing the output clock signal and a delayed signal for a digitally controlled delay unit.

15. The method of claim 14, wherein the divider is a multi-modulus digital divider.

16. The method of claim 14, wherein the gain calibration factor is determined using least mean square correlation.

17. The method of claim 14, further comprising providing a value for the divider using a a ratio-based digital modulator, where both a numerator and a denominator of the value are very fine resolution digital controls or modulation signals.

18. The method of claim 14, wherein the output clock signal is between 1 and 5 gigahertz.

19. A method of providing fractional frequency division on an input clock signal, the method comprising:
providing a divided clock signal from a divider in response to the input clock signal;
delaying the divided clock signal in response to a truncation phase error and gain calibration factor from a calibration unit to provide an output clock signal having equal periods; and
detecting residual phase error in the calibration unit.

20. The method of claim 19, further comprising:
comparing the output clock signal and a delayed signal for a digitally controlled delay unit.

* * * * *